United States Patent
Aota et al.

(10) Patent No.: US 10,566,405 B2
(45) Date of Patent: Feb. 18, 2020

(54) DISPLAY DEVICE

(71) Applicant: Japan Display Inc., Tokyo (JP)

(72) Inventors: Shinichi Aota, Tokyo (JP); Hidenori Kidani, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/012,968

(22) Filed: Jun. 20, 2018

(65) Prior Publication Data

US 2018/0374913 A1    Dec. 27, 2018

(30) Foreign Application Priority Data

Jun. 22, 2017 (JP) .................................. 2017-122389

(51) Int. Cl.
| | | |
|---|---|---|
| *H01L 27/32* | (2006.01) | |
| *G02F 1/1362* | (2006.01) | |
| *G02F 1/1345* | (2006.01) | |

(52) U.S. Cl.
CPC ...... *H01L 27/3276* (2013.01); *G02F 1/13452* (2013.01); *G02F 1/13454* (2013.01); *G02F 1/136286* (2013.01); *H01L 27/3272* (2013.01); *G02F 2201/50* (2013.01)

(58) Field of Classification Search
None
See application file for complete search history.

(56) References Cited

U.S. PATENT DOCUMENTS

| | | | | |
|---|---|---|---|---|
| 6,172,730 | B1* | 1/2001 | Fujita | G02F 1/13452 349/138 |
| 2002/0135727 | A1 | 9/2002 | Nakaminami et al. | |
| 2012/0262898 | A1* | 10/2012 | Yamada | H05K 9/0039 361/818 |
| 2017/0148702 | A1* | 5/2017 | Funayama | G02F 1/13452 |

FOREIGN PATENT DOCUMENTS

JP    2002-358026 A    12/2002

* cited by examiner

*Primary Examiner* — Shaun M Campbell
(74) *Attorney, Agent, or Firm* — Michael Best & Friedrich LLP

(57) ABSTRACT

According to one embodiment, a display device includes a display panel including a first insulating substrate, a first electrode disposed above the first insulating substrate, an IC chip electrically connected to the first electrode, a first terminal electrically connected to the IC chip, and a wiring substrate including a base including a first surface and a second surface on a side opposite to the first surface, a second terminal which is disposed on the first surface and is electrically connected to the first terminal, and an electromagnetic shielding layer which is disposed on the second surface and covers at least a part of the IC chip.

19 Claims, 10 Drawing Sheets

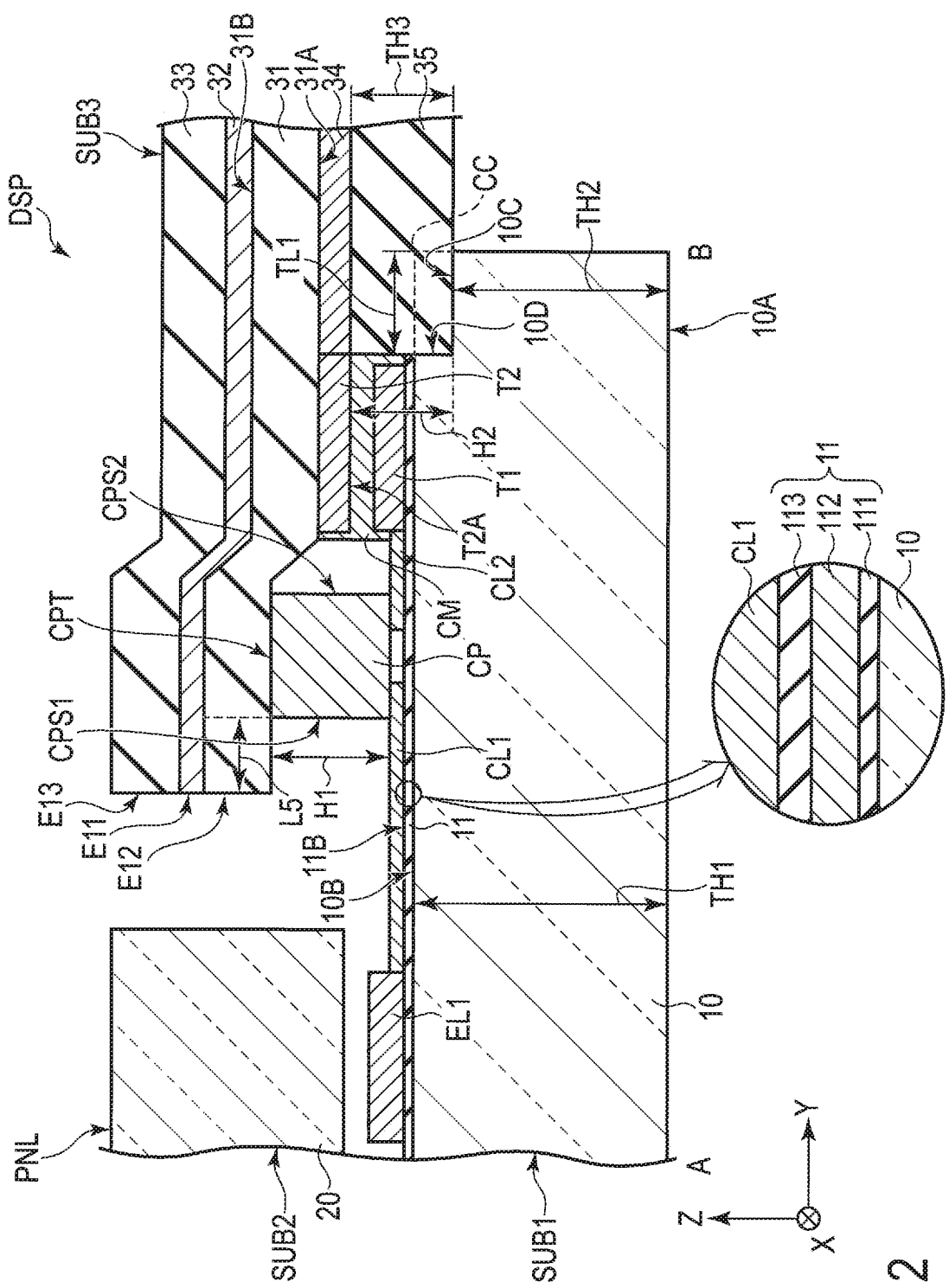
F I G. 2

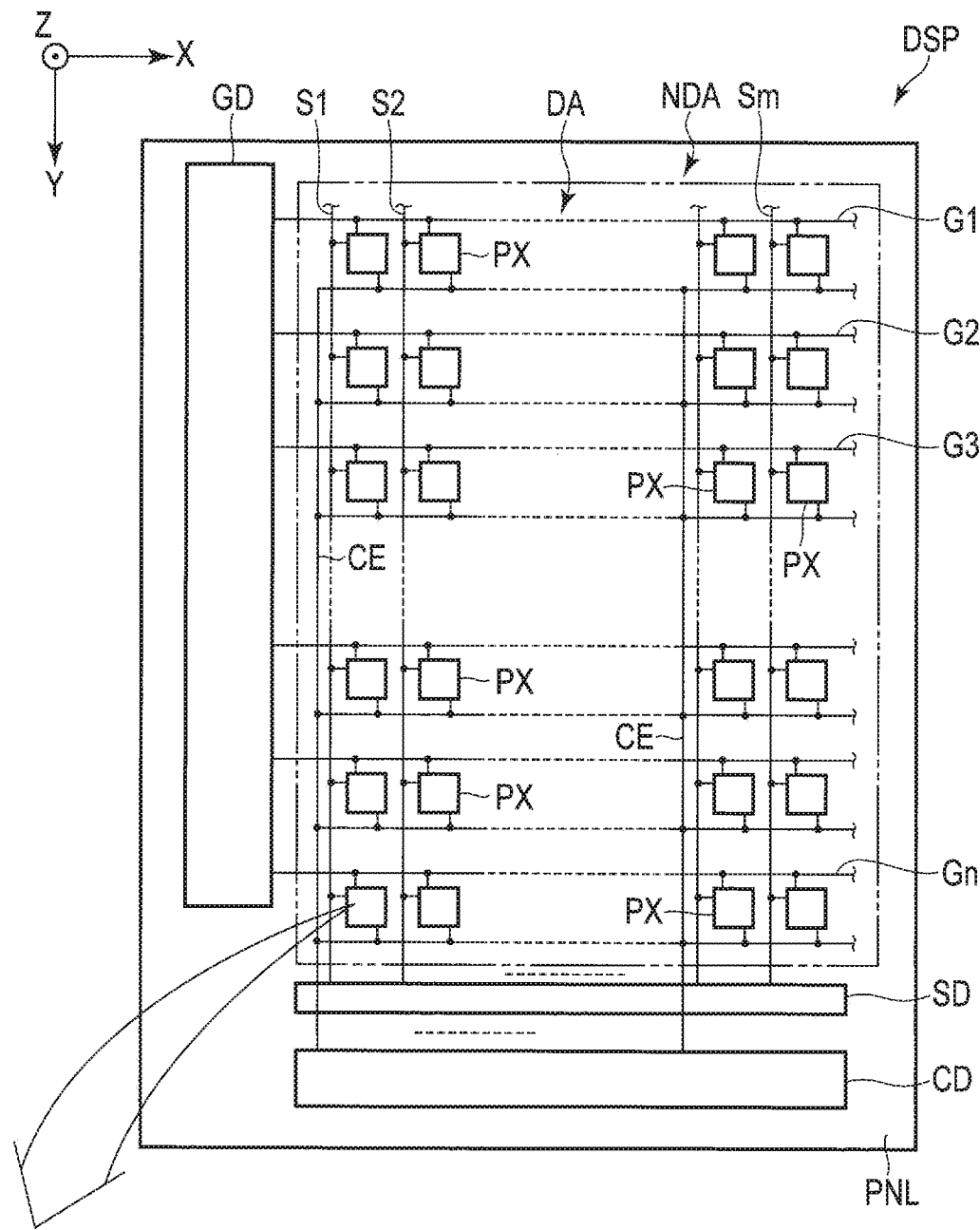
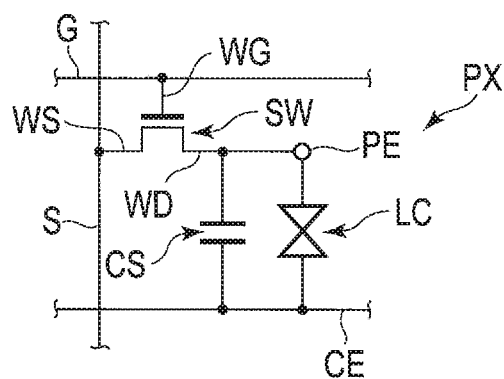
FIG. 4

DISPLAY DEVICE

CROSS-REFERENCE TO RELATED APPLICATIONS

This application is based upon and claims the benefit of priority from Japanese Patent Application No. 2017-122389, filed Jun. 22, 2017, the entire contents of which are incorporated herein by reference.

FIELD

Embodiments described herein relate generally to a display device.

BACKGROUND

A flexible printed circuit connected to a display panel comprises an insulating protective layer for protecting a conductive layer provided on a base. In one example, the insulating protective layer is formed to overlap the display panel. When the display panel is set on an electronic device body, the flexible printed circuit is folded. Thus, the flexible printed circuit may contact a corner portion of the display panel, and a break of the conductive layer may be caused. Further, because the flexible printed circuit is pressed when it is connected to the display panel, a break of the conductive layer may be caused. Furthermore, because the conductive layer is exposed, corrosion of the conductive layer may occur. For this reason, it is required to prevent a break or corrosion of the conductive layer, and improve the reliability.

BRIEF DESCRIPTION OF THE DRAWINGS

FIG. 2 is an illustration showing a cross-section of the display device DSP shown in FIG. 1 taken along line A-B.

FIG. 4 is an illustration showing a basic structure and an equivalent circuit of a display panel PNL.

DETAILED DESCRIPTION

Figure 1:
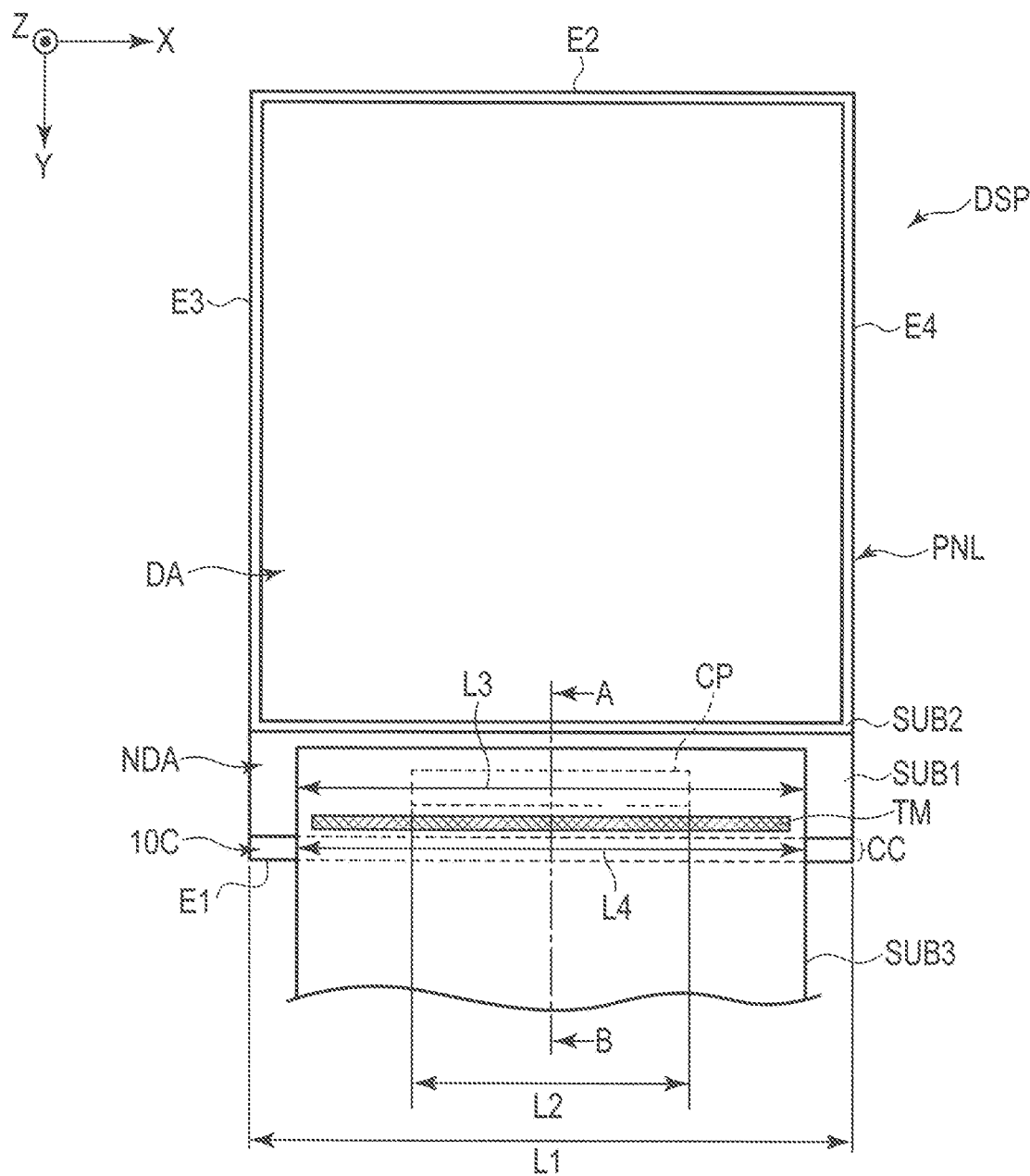
FIG. 1 is an illustration showing the structure of a display device DSP of the present embodiment.

In general, according to one embodiment, a display device includes: a display panel including a first insulating substrate, a first electrode disposed on the first insulating substrate, an IC chip electrically connected to the first electrode, a first terminal electrically connected to the IC chip; and a wiring substrate including a base including a first surface and a second surface opposite to the first surface, a second terminal disposed on the first surface and electrically connected to the first terminal, and an electromagnetic shielding layer disposed on the second surface and covering at least a part of the IC chip According to another embodiment, a display device includes: a display panel including a first insulating substrate and a first terminal, the first insulating substrate including a first plane, a second plane on a side opposite to the first plane, and a third plane at a position different from the second plane on the side opposite to the first plane, a thickness between the first plane and the second plane being greater than a thickness between the first plane and the third plane, the first terminal being disposed above the second plane; and a wiring substrate including a base, a second terminal which is disposed on the base and is electrically connected to the first terminal, a first conductive layer connecting with the second terminal, and an insulating cover covering the first conductive layer and being in contact with the third plane.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are illustrated in the drawings schematically, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, and redundant detailed description thereof is omitted unless necessary.

FIG. 1 is an illustration showing the structure of a display device DSP of the present embodiment. While a first direction X, a second direction Y, and a third direction Z in the figure are orthogonal to each other, they may cross each other at an angle other than 90 degrees. The first direction X and the second direction Y correspond to directions parallel to a main surface of a substrate which constitutes the display device DSP, and the third direction Z corresponds to a thickness direction of the display device DSP.

In the explanation given below, a position represented by a pointing end side of an arrow indicating the third direction Z will be referred to as "above", and a position represented by a rear end side of the arrow will be referred to as "below". In the present specification, when there is a description "A on B", A may be in contact with B, or C may be interposed between A and B except when the specification explicitly describes "A directly on B". When there are descriptions "a second member above a first member" and "a second member below a first member", the second member may be in contact with the first member or may be separated from the first member. Further, viewing an X-Y plane defined by the first direction X and the second direction Y from the pointing end side of the arrow indicating the third direction Z is called a planar view. Further, viewing a Y-Z plane defined by the second direction Y and the third direction Z along an arrow indicating the first direction X, and viewing an X-Z plane defined by the first direction X and the third direction Z along an arrow indicating the second direction Y will be referred to as a cross-sectional view.

The display device DSP comprises a display panel PNL comprising a first substrate SUB1 and a second substrate SUB2, a wiring substrate SUBS, and an IC chip CP. The first substrate SUB1 and the second substrate SUB2 are opposed to each other in the third direction Z. The display panel PNL includes a display area DA in which an image is displayed, and a frame-shaped non-display area NDA surrounding the display area DA. The display panel PNL includes a first side E1 and a second side E2 along the first direction X, and a third side E3 and a fourth side E4 along the second direction Y. The first substrate SUB1 includes a concavity CC and a terminal portion TM. While details of the concavity CC will be described later, in the example illustrated, the concavity CC includes a third plane 10C to be described later. The third plane 10C corresponds to a bottom surface of the concavity CC. The third plane 10C extends along the first direction X, and is formed over the entire first side E1, in other words, is formed continuously from the third side E3 to the fourth side E4. The concavity CC has a length L1 along the first direction X. The length L1 is equal to a length along the first direction between the third side E3 and the fourth side E4. The terminal portion TM comprises a plurality of terminals arranged at intervals in the first direction X, though not described in detail. The terminal portion TM is located in a non-display area NDA between the concavity CC and the IC chip CP.

The IC chip CP is located in the non-display area NDA between the concavity CC and the display area DA. In the IC chip CP, a display driver which outputs a signal necessary for image display, for example, is incorporated. The display driver described in this specification includes at least a part of a signal line drive circuit SD, a scanning line drive circuit GD, and a common electrode drive circuit CD, which will be described later. The IC chip CP has a length L2 along the first direction X.

The wiring substrate SUB3 is connected to the display panel PNL in the terminal portion TM. The wiring substrate SUB3 extends toward the display area DA beyond the terminal portion TM, and overlaps the IC chip CP in a planar view. The wiring substrate SUB3 has a length L3 greater than the length L2 of the IC chip CP at a position overlapping the IC chip CP. Also, the wiring substrate SUB3 extends outside the display panel PNL in the second direction Y beyond the terminal portion TM, and overlaps the concavity CC in the planar view. The wiring substrate SUB3 has a length L4 less than the length L1 of the concavity CC at a position overlapping the concavity CC. Note that the length L3 may be equal to the length L4, or may be different from the length L4.

Note that the display panel PNL has a transmissive display function of displaying an image by selectively passing light from a rear surface of the first substrate SUB1, but the function is not limited to this. For example, the display panel PNL may have a reflective display function of displaying an image by selectively reflecting light from a front surface of the second substrate SUB2, or both the transmissive display function and the reflective display function.

Further, the wiring substrate SUB3 is, for example, a flexible substrate having flexibility. It is sufficient if the flexible substrate applicable in the present embodiment comprises a flexible part formed of a foldable material in at least a part of the flexible substrate. For example, the wiring substrate SUBS of the present embodiment may be a flexible substrate which is constituted as a flexible part in its entirety, or may be a rigid-flexible substrate comprising a rigid part formed of a hard material such as glass epoxy and a flexible part formed of a foldable material such as polyimide.

FIG. 2 is an illustration showing a cross-section of the display device DSP shown in FIG. 1 taken along line A-B. The first substrate SUB1 includes a first insulating substrate 10, a multi-layered body 11, a first electrode EL1, a first terminal T1, the IC chip CP, and wiring lines CL1 and CL2.

The first insulating substrate 10 is, for example, a glass substrate or a resin substrate. The first insulating substrate 10 includes a first plane 10A, a second plane 10B, the third plane 10C, and a side surface 10D. The second plane 10B and the third plane 10C are located on a side opposite to the first plane 10A. The third plane 10C is at a position different from the second plane 10B. A thickness TH1 between the first plane 10A and the second plane 10B along the third direction Z is greater than a thickness TH2 between the first plane 10A and the third plane 10C along the third direction Z. A difference in level between the second plane 10B and the third plane 10C corresponds to the concavity CC shown in FIG. 1. In the example illustrated, although the first plane 10A, the second plane 10B, and the third plane 10C are all parallel to the X-Y plane, at least one of the above planes may intersect the X-Y plane. The side surface 10D is located between the second plane 10B and the third plane 10C. In the example illustrated, although the side surface 10D is a plane parallel to the X-Z plane, it may be a plane intersecting the X-Z plane. A width TL1 of the third plane 10C along the second direction Y is, for example, 0.2 to 0.5 μm.

The multi-layered body 11 is disposed on the second plane 10B. The multi-layered body 11 includes at least one insulating layer, and at least one conductive layer. In the example illustrated, the multi-layered body 11 comprises an insulating layer 111 located on the first insulating substrate 10, a third conducive layer 112 located on the insulating layer 111, and an insulating layer 113 located between the third conducive layer 112 and the wiring line CL1. In the example illustrated, the multi-layered body 11 is not disposed on the third plane 10C. In this way, it is possible to prevent the third conductive layer 112 included in the multi-layered body 11 from being exposed, and prevent corrosion of the third conductive layer 112. Note that at least a part of the multi-layered body 11 may be disposed on the third plane 10C. Alternatively, it is possible to assume that a difference in level between an upper surface 11B of the multi-layered body 11 and the third plane 10C corresponds to the above-mentioned concavity CC.

The first electrode EL1, the first terminal T1, the wiring lines CL1 and CL2 are disposed on the multi-layered body 11. The wiring line CL1 electrically connects the first electrode EL1 and the IC chip CP. The wiring line CL2 electrically connects the first terminal T1 and the IC chip CP. The first electrode EL1 is located in the display area DA shown in FIG. 1. The first terminal T1 is located in the terminal portion TM shown in FIG. 1. The first electrode EL1 and the first terminal T1 are electrically connected to each other via the IC chip CP. The IC chip CP and a second insulating substrate 20 are arranged in the second direction Y. The IC chip CP includes an upper surface CPT on a side opposite to the first insulating substrate 10, a side surface CPS1 opposed to the second insulating substrate 20, and a side surface CPS2 on a side opposite to the side surface CPS1. The side surface CPS2 is opposed to the first terminal T1.

The second substrate SUB2 comprises at least the second insulating substrate 20. The second insulating substrate 20 is, for example, a glass substrate, a resin substrate, or the like. The second insulating substrate 20 is located above the first electrode EL1.

The wiring substrate SUBS comprises a base 31, an electromagnetic shielding layer 32, an overcoat layer 33, a first conductive layer 34, an insulating cover 35, and a second terminal T2.

The base 31 is formed of a resin material such as polyimide. The base 31 includes a first surface 31A on a side opposed to the first substrate SUB1, and a second surface 31B on a side opposite to the first surface 31A. The second terminal T2 is disposed on the first surface 31A, and is opposed to the first terminal T1 in the third direction Z. The first terminal T1 and the second terminal T2 are electrically connected to each other by a conductive adhesive layer CM interposed between these terminals. The conductive adhesive layer CM covers the first terminal T1 and the second terminal T2. The conductive adhesive layer CM is, for example, an anisotropic conductive film in which conductive particles are dispersed in an adhesive. The electromagnetic shielding layer 32 is disposed on the second surface 31B. The electromagnetic shielding layer 32 is a conductor layer formed of silver, etc. The overcoat layer 33 covers the electromagnetic shielding layer 32. The overcoat layer 33 is formed of a resin material such as acrylic resin.

The electromagnetic shielding layer 32 covers at least a part of the IC chip CP. Note that by the expression "cover", not only a case where the electromagnetic shielding layer 32 contacts the IC chip CP, but also a case where the base 31 is interposed between the electromagnetic shielding layer 32 and the IC chip CP is included. In the example illustrated, the electromagnetic shielding layer 32 covers the entire upper surface CPT. Note that the wiring substrate SUB3 may be in contact with the IC chip CP, bonded to the IC chip CP, or separated from the IC chip CP. Here, it suffices that the wiring substrate SUB3 is located above the IC chip CP.

A first end portion E11 of the electromagnetic shielding layer 32 is located directly above the side surface CPS1, or on a side closer to the second insulating substrate 20 than the side surface CPS1. In the example illustrated, the first end portion E11 is located between the IC chip CP and the second insulating substrate 20. Even if the electromagnetic shielding layer 32 is extended linearly in the X-Y plane, the first end portion E11 should preferably be separated from the second insulating substrate 20. The reason for this is to prevent occurrence of a short-circuit between a conductive layer and the electromagnetic shielding layer 32, if the second substrate SUB2 includes a conductive layer. Further, preferably, a length L5 from the first end portion E11 of the electromagnetic shielding layer 32 to the IC chip CP along the second direction Y should be less than a height H1 of the IC chip CP along the third direction Z. The reason for this is to prevent a short-circuit between the electromagnetic shielding layer 32 and the wiring line CL1 even if the electromagnetic shielding layer 32 droops along the side surface CPS1.

Note that although the first end portion E11 is located directly above a second end portion E12 of the base 31, and is also located directly under a third end portion E13 of the overcoat layer 33, the arrangement is not limited to this example. Variations of the positional relationship between the first to third end portions will be described in detail later.

The first conductive layer 34 is disposed on the first surface 31A, and connects with the second terminal T2. The first conductive layer 34 and the second terminal T2 are formed of a conductive material such as copper. The insulating cover 35 covers the first conductive layer 34 without covering the second terminal T2. The insulating cover 35 is in contact with the third plane 10C. In the example illustrated, although the insulating cover 35 is also in contact with the side surface 10D, the insulating cover 35 may be separated from the side surface 10D. Note that the insulating cover 35 is not bonded to either the third plane 10C or the side surface 10D. Further, a moisture-proof insulating material is not arranged between the first insulating substrate 10 and the insulating cover 35. The insulating cover 35 is formed of a resin material such as polyimide. A height H2 from the third plane 10C to a connection surface T2A of the second terminal T2, which is a surface of connection with the first terminal T1, along the third direction Z is substantially equal to a thickness TH3 of the insulating cover 35 on the third plane 10C along the third direction Z.

In the following, an example of the dimension will be described. The height H1 of the IC chip CP is 100 to 150 μm, and the length L5 of the electromagnetic shielding layer 32 is 80 to 120 μm. In the first insulating substrate 10, the thickness TH1 is 125 to 170 μm, the thickness TH2 is 75 to 145 μm, and the difference in level between the second plane 10B and the third plane 10C is 25 to 50 μm. In the wiring substrate SUB3, the thickness TH3 of the insulating cover 35 is 20 μm, and is substantially equal to the height H2.

Figure 3:
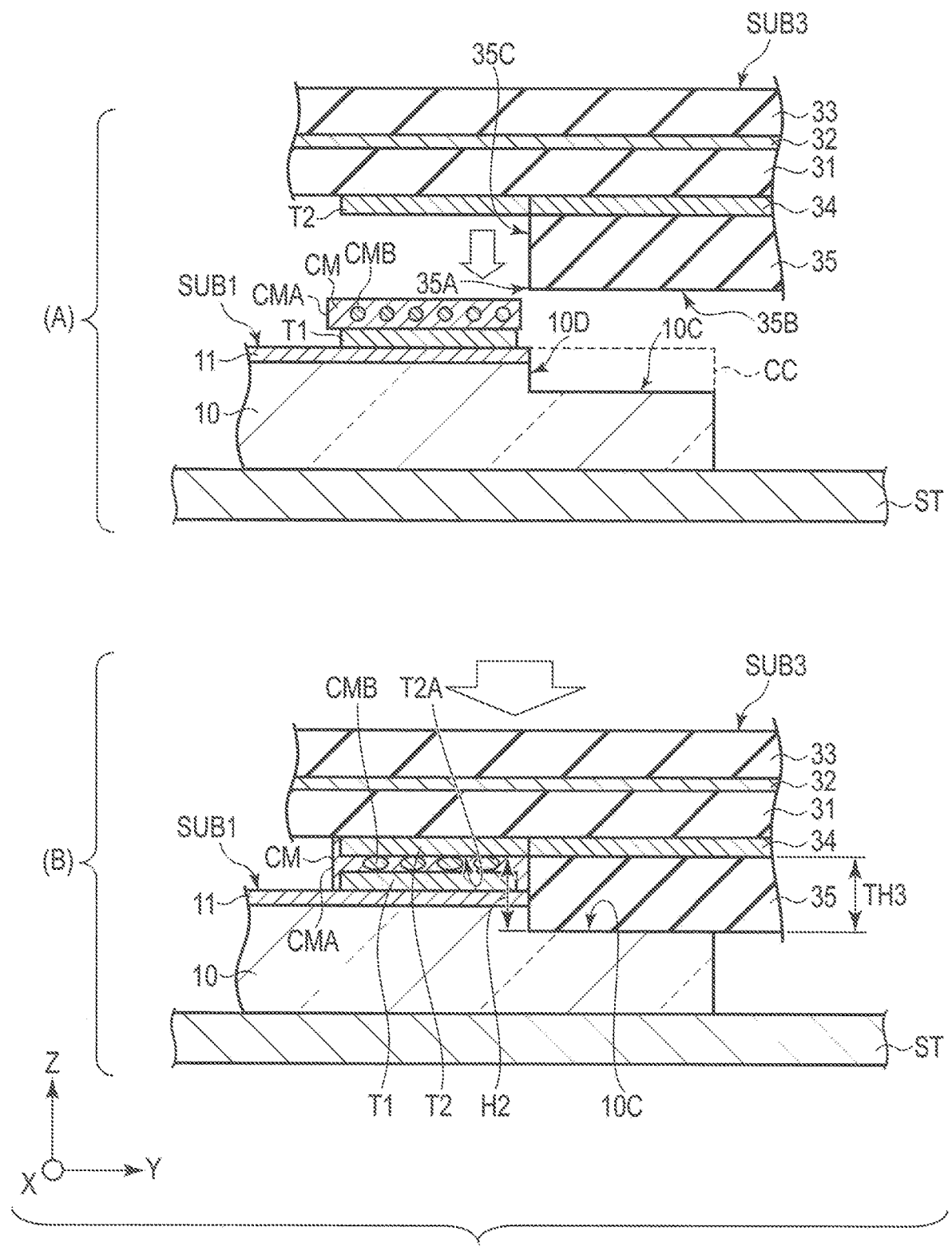
FIG. 3 is an illustration for explaining a process in which a wiring substrate SUBS is connected to a first substrate SUB1.

FIG. 3 is an illustration for explaining a process in which the wiring substrate SUB3 is connected to the first substrate SUB1. In the figure, only the structures necessary for the explanation are depicted.

As shown in FIG. 3(A), the first substrate SUB1 is arranged on a stage ST. The conductive adhesive layer CM is disposed on the first terminal T1. The wiring substrate SUB3 waits above the first substrate SUB1 with the second terminal T2 facing downward. Further, the first substrate SUB1 and the wiring substrate SUB3 are positioned such that the first terminal T1 and the second terminal T2 overlap one another. Further, the wiring substrate SUB3 is arranged above the first substrate SUB1 such that the second terminal T2 overlaps the conductive adhesive layer CM, and a distal portion 35A of the insulating cover 35 fits into the concavity CC. In this arrangement, of the distal portion 35A, a lower surface 35B is in contact with the third plane 10C, and a side surface 35C is in contact with the side surface 10D. By this feature, not only is the positioning of the first substrate SUB1 and the wiring substrate SUB3 facilitated, but displacement of the wiring substrate SUB3 relative to the first substrate SUB1 after the positioning can be suppressed.

After that, as shown in FIG. 3(B), the wiring substrate SUB3 is pressed against the first substrate SUB1. In other words, the wiring substrate SUB3 is pressed toward the first substrate SUB1 while being heated. In this way, an adhesive CMA of the conductive adhesive layer CM is temporary melted, and covers the first terminal T1 and the second terminal T2 and bonds the two. Simultaneously, conductive particles CMB of the conductive adhesive layer CM eat into the first terminal T1 and the second terminal T2, and electrically connect the two. Also, as described above, since the height H2 from the third plane 10C to the connection surface T2A and the thickness TH3 of the insulating cover 35 on the third plane 10C are equal to each other, the wiring substrate SUB3 is evenly pressed. Note that in the present embodiment, since the first conductive layer 34 is covered by the insulating cover 35, and the area of exposure of the first conductive layer 34 is reduced, a step of applying a moisture-proof insulating material for preventing corrosion of the first conductive layer 34 between the first insulating substrate 10 and the insulating cover 35 is omitted.

According to the present embodiment shown in FIGS. 1 to 3 above, the wiring substrate SUB3 comprises the electromagnetic shielding layer 32 which covers at least a part of the IC chip CP. For this reason, electromagnetic interference (EMI) noise from the IC chip CP can be suppressed. More specifically, since the electromagnetic shielding layer 32 overlaps at least the upper surface CPT and the side surface CPS2 of the IC chip CP, the electromagnetic interference noise from the upper surface CPT and the side surface CPS2 can be suppressed. Further, since the electromagnetic shielding layer 32 is extended toward the second substrate SUB2 beyond the side surface CPS1, the electromagnetic interference noise from the side surface CPS1 can be suppressed.

Also, since the first end portion E11 of the electromagnetic shielding layer 32 is separated from the second substrate SUB2, even if the second substrate SUB2 includes a conductive layer, it is possible to prevent a short-circuit from occurring between the electromagnetic shielding layer 32 and the conductive layer. Further, since the length L5 from the first end portion E11 to the IC chip CP is less than the height H1 of the IC chip CP, even if the electromagnetic shielding layer 32 droops along the side surface CPS1, it is possible to prevent a short-circuit from occurring between the electromagnetic shielding layer 32 and the wiring line CL1.

In addition, the wiring substrate SUB3 comprises the insulating cover 35 which covers the first conductive layer 34, and is also in contact with the third plane 10C of the concavity CC. Consequently, when the wiring substrate SUB3 is pressed against the first substrate SUB1, the wiring substrate SUB3 can be pressed evenly without being affected by a difference in level due to the thickness TH3 of the insulating cover 35. Accordingly, strong pressure is not applied to the first conductive layer 34 locally, and a break of the first conductive layer 34 can be suppressed.

Also, since the concavity CC extends to a place near the first terminal T1, the first conductive layer 34 in the proximity of the second terminal T2 covered with the conductive adhesive layer CM can be covered by the insulating cover 35. Consequently, the area of exposure of the first conductive layer 34 can be reduced. Accordingly, corrosion of the first conductive layer 34 can be suppressed without arranging a moisture-proof insulating material for preventing corrosion of the first conductive layer 34 between the first substrate SUB1 and the insulating cover 35. Further, when the wiring substrate SUB3 is folded toward a back surface of the display panel PNL, as will be described later, since the insulating cover 35 is interposed between the first substrate SUB1 and the first conductive layer 34, the first conductive layer 34 does not contact a corner part of the first substrate SUB1, and a break of the first conductive layer 34 can be suppressed.

Consequently, the reliability can be improved.

Next, a liquid crystal panel will be described as a specific example of the display panel PNL.

FIG. 4 is an illustration showing a basic structure and an equivalent circuit of the display panel PNL. The display panel PNL includes pixels PX in the display area DA. Here, the pixel indicates a minimum unit which can be individually controlled in accordance with a pixel signal, and exists, for example, in an area including a switching element arranged at a position where a scanning line and a signal line, which will be described later, cross each other. The pixels PX are arrayed in a matrix in the first direction X and the second direction Y. Also, the display panel PNL includes scanning lines G (G1 to Gn), signal lines S (S1 to Sm), a common electrode CE, etc., in the display area DA. The scanning lines G extend in the first direction X, and are arranged in the second direction Y. The signal lines S extend in the second direction Y, and are arranged in the first direction X. Note that the scanning lines G and the signal lines S do not need to extend linearly but may be partially bent. The common electrode CE is disposed over the pixels PX. Each of the scanning lines G, the signal lines S, and the common electrode CE is drawn to the non-display area NDA. In the non-display area NDA, the scanning lines G are connected to a scanning line drive circuit GD, the signal lines S are connected to a signal line drive circuit SD, and the common electrode CE is connected to a common electrode drive circuit CD. The signal line drive circuit SD, the scanning line drive circuit GD, and the common electrode drive circuit CD may be formed on the first substrate SUB1, or a part or a whole of these circuits may be incorporated in the IC chip CP shown in FIG. 1.

Each of the pixels PX comprises a switching element SW, a pixel electrode PE, the common electrode CE, a liquid crystal layer LC, and the like. The switching element SW is constituted by a thin-film transistor (TFT), for example, and is electrically connected to the scanning line G and the signal line S. More specifically, the switching element SW includes a gate electrode WG, a source electrode WS, and a drain electrode WD. The gate electrode WG is electrically connected to the scanning ling G. In the example illustrated, the electrode electrically connected to the signal line S is referred to as the source electrode WS, and the electrode electrically connected to the pixel electrode PE is referred to as the drain electrode WD.

The scanning line G is connected to the switching elements SW of the respective pixels PX arranged in the first direction X. The signal line S is connected to the switching elements SW of the respective pixels PX arranged in the second direction Y. Each pixel electrode PE is opposed to the common electrode CE, and drives the liquid crystal layer LC by an electric field produced between the pixel electrode PE and the common electrode CE. A storage capacitance CS is formed between, for example, the common electrode CE and the pixel electrode PE.

Figure 5:
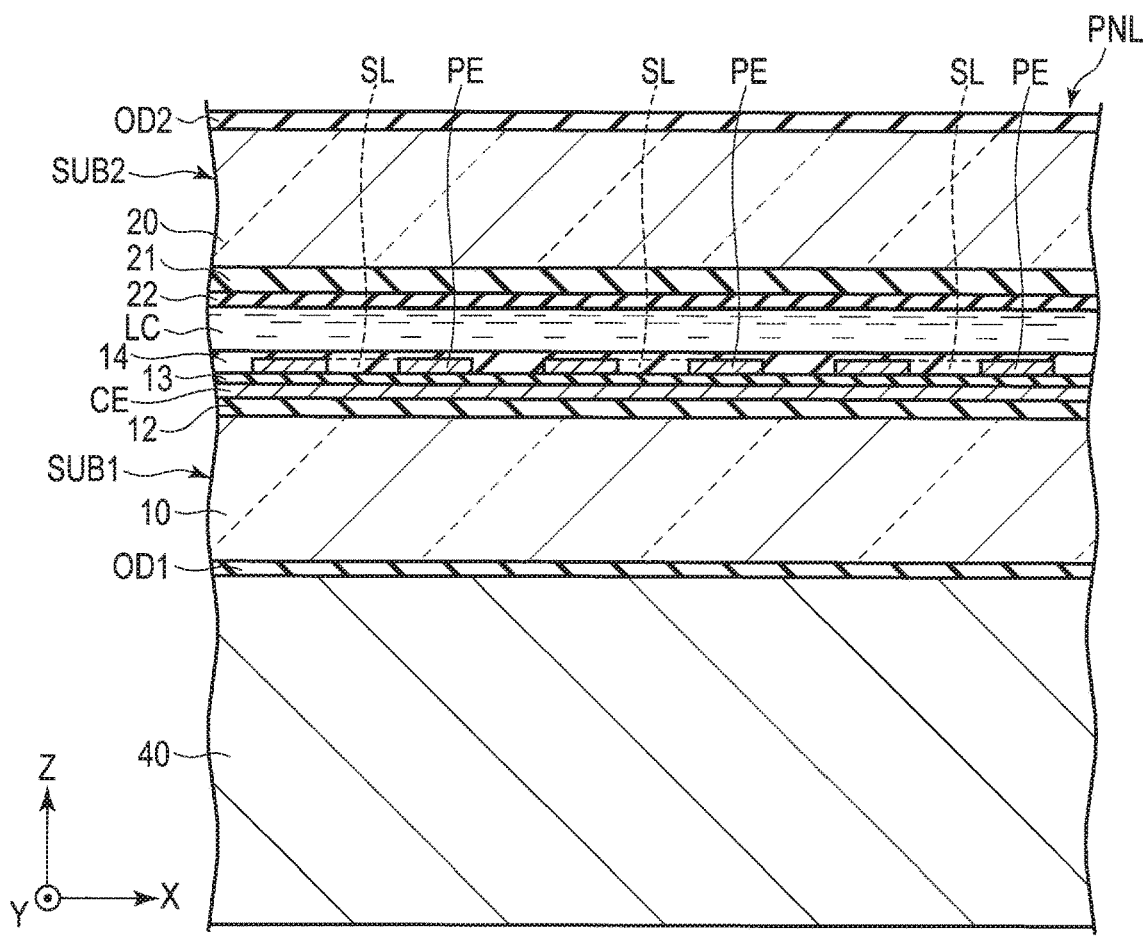
FIG. 5 is an illustration showing a cross-section of a part of the display panel PNL shown in FIG. 4.

FIG. 5 is an illustration showing a cross-section of a part of the display panel PNL shown in FIG. 4. Here, only the main portions necessary for explanation are shown. Note that the illustrated display panel PNL has a structure corresponding to a display mode primarily using a lateral electric field which is substantially parallel to a main surface of the substrate, but the structure is not particularly limited. The display panel may have a structure corresponding to a display mode using a longitudinal electric field perpendicular to the main surface of the substrate, an oblique electric field inclined to the main surface of the substrate, or a combination of these electric fields. In the display mode using the lateral electric field, a structure including both the pixel electrode PE and the common electrode CE in one of the first substrate SUB1 and the second substrate SUB2, for example, can be applied. In the display mode using the longitudinal electric field or the oblique electric field, a structure in which one of the pixel electrode PE and the common electrode CE is provided in the first substrate SUB1, and the other one of the pixel electrode PE and the common electrode CE is provided in the second substrate SUB2, for example, can be applied. It should be noted that the main surface of the substrate is a surface parallel to the X-Y plane.

The first substrate SUB1 comprises the first insulating substrate 10, an insulating layer 12, an insulating layer 13, a first alignment film 14, the common electrode CE, the pixel electrode PE, etc. Although illustration of elements such as the switching element SW, the scanning lines G, and the signal lines is omitted, they are located between the first insulating substrate 10 and the insulating layer 12. The common electrode CE is located between the insulating layers 12 and 13. The pixel electrode PE is located between the insulating layer 13 and the first alignment film 14. The pixel electrode PE includes a slit SL at a position opposed to the common electrode CE. The common electrode CE and the pixel electrode PE are formed of a transparent conductive material such as indium-tin-oxide (ITO) or indium-zinc-oxide (IZO). The first electrode EL1 shown in FIG. 2 corresponds to the illustrated pixel electrode PE, and the common electrode CE and the insulating layers 12 and 13 are included in the multi-layered body 11. Note that there may be a case where the first electrode EL1 corresponds to the common electrode CE. In this case, the insulating layer 12 is included in the multi-layered body 11.

Alternatively, the pixel electrode PE may be located between the insulating layers 12 and 13, and the common electrode CE may be located between the insulating layer 13 and the first alignment film 14. In this case, the pixel electrode PE is formed in a plate shape having no slit for each pixel, and the common electrode CE includes slits opposed to the pixel electrode PE. Also, both of the pixel electrode PE and the common electrode CE may be arranged in the first direction X. For example, the pixel electrode PE and the common electrode CE may both be formed in a comb-like shape, and arranged so that they are engaged with each other. In such arrangement, for example, the insulating layer 13 which has been illustrated may be omitted, and both of the pixel electrode PE and the common electrode CE may be located between the insulating layer 12 and the first alignment film 14. Alternatively, one of the pixel electrode PE and the common electrode CE may be located between the insulating layer 12 and the insulating layer 13, and the other one of the pixel electrode PE and the common electrode CE may be located between the insulating layer 13 and the first alignment film 14.

The second substrate SUB2 includes the second insulating substrate 20, an organic insulating layer 21, a second alignment film 22, etc. The organic insulating layer 21 includes a light-shielding layer, a color filter layer, an overcoat layer, etc. The liquid crystal layer LC is located between the first substrate SUB1 and the second substrate SUB2. A first optical element OD1 including a polarizer, etc., is located between the first insulating substrate 10 and an illumination device 40. A second optical element OD2 including a polarizer, etc., is located on the second insulating substrate 20.

Next, as another specific example of the display panel PNL, an organic electroluminescent (EL) panel will be explained.

Figure 6:
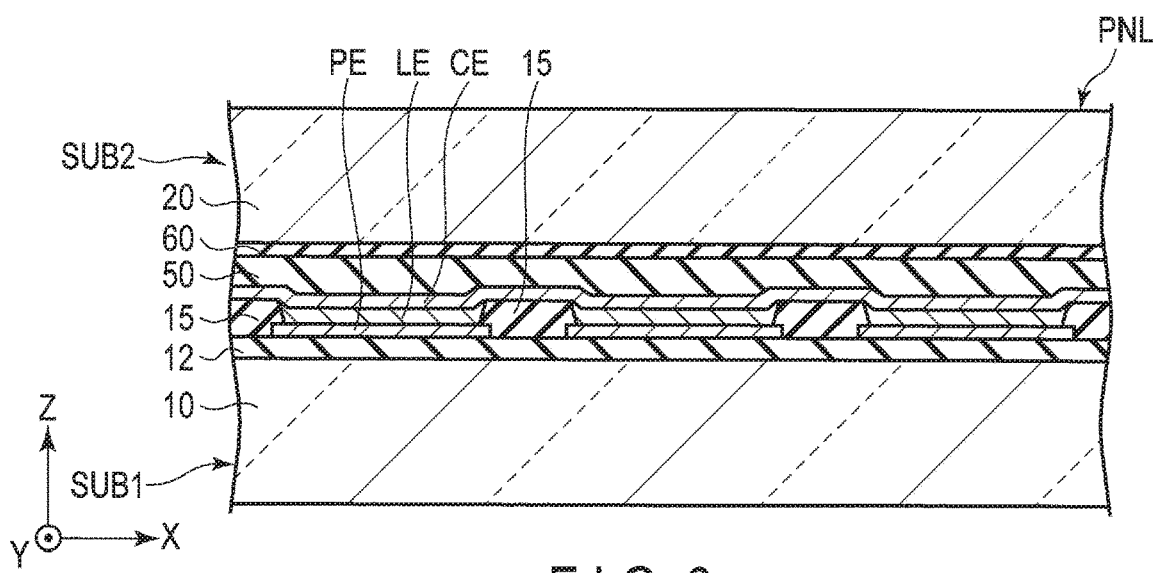
FIG. 6 is an illustration showing a cross-section of a part of the other display panel PNL.

FIG. 6 is an illustration showing a cross-section of a part of the other display panel PNL. Here, only the main portions necessary for explanation are shown.

The first substrate SUB1 comprises the first insulating substrate 10, the insulating layer 12, a rib 15, the pixel electrode PE, a light-emitting layer LE, the common electrode CE, etc. The pixel electrode PE is located on the insulating layer 12. A peripheral portion of the pixel electrode PE overlaps the rib 15. The light-emitting layer LE is located on the pixel electrode PE. The common electrode CE is located on the light-emitting layer LE and the rib 15. The first electrode EL1 shown in FIG. 2 corresponds to the illustrated common electrode CE, and the insulating layer 12, the pixel electrode PE, the light-emitting layer LE, and the rib 15 are included in the multi-layered body 11. Note that there may be a case where the first electrode EL1 corresponds to the pixel electrode PE. In this case, the insulating layer 12 is included in the multi-layered body 11. A sealing film 50 is disposed on the common electrode CE.

The second substrate SUB2 comprises the second insulating substrate 20, etc. The second substrate SUB2 and the sealing film 50 are bonded to each other by an adhesive layer 60.

Next, variations of the positional relationship between the first to third end portions will be described.

Figure 7:
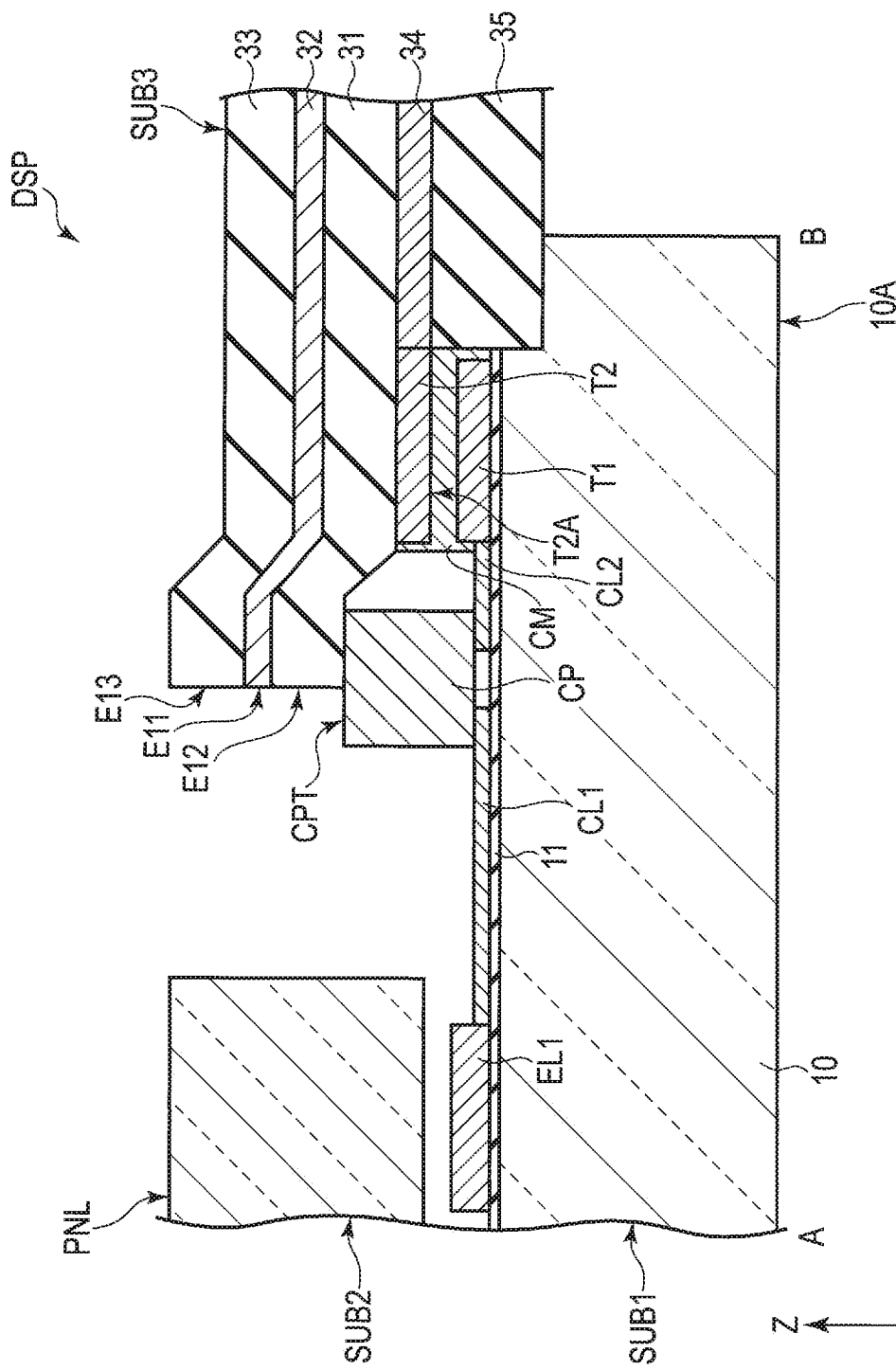
FIG. 7 is an illustration showing another cross-section of the display device DSP.

FIG. 7 is an illustration showing another cross-section of the display device DSP. A configuration example illustrated in FIG. 7 is different from that shown in FIG. 2 in that the electromagnetic shielding layer 32 covers a part of the upper surface CPT. Of the upper surface CPT, although a side close to the second terminal T2 is covered with the electromagnetic shielding layer 32, a side close to the second substrate SUB2 is exposed from the electromagnetic shielding layer 32. In other words, the first end portion E11 of the electromagnetic shielding layer 32 is located directly above the upper surface CPT. In the example illustrated, the second end portion E12 of the base 31 and the third end portion E13 of the overcoat layer 33 are also located directly above the upper surface CPT. Note that although the second end portion E12, the first end portion E11, and the third end portion E13 are arranged along the third direction Z, their positions may be shifted from each other in the second direction Y.

Also in this configuration example, the same advantages as that of the above-described configuration example can be obtained.

Figure 8:
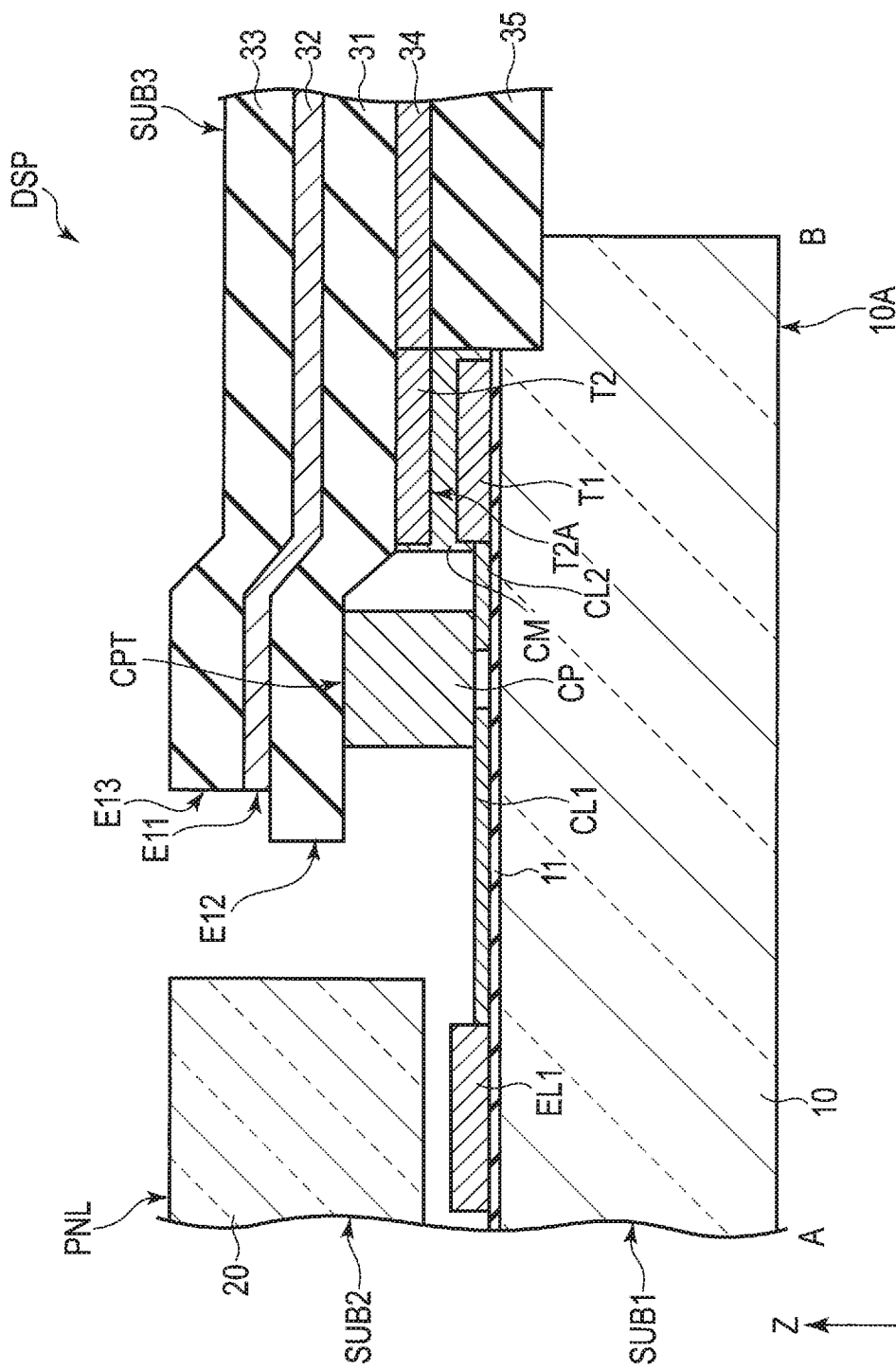
FIG. 8 is an illustration showing yet another cross-section of the display device DSP.

FIG. 8 is an illustration showing yet another cross-section of the display device DSP. A configuration example illustrated in FIG. 8 is different from that shown in FIG. 2 in that the base 31 includes the second end portion E12 closer to the second insulating substrate 20 than the first end portion E11 of the electromagnetic shielding layer 32. It suffices that the electromagnetic shielding layer 32 covers at least a part of the upper surface CPT. In the example illustrated, the first end portion E11 and the second end portion E12 are located between the IC chip CP and the second insulating substrate 20. Note that although the first end portion E11 and the third end portion E13 are arranged along the third direction Z, their positions may be shifted from each other in the second direction Y.

Also in this configuration example, the same advantages as that of the above-described configuration example can be obtained. Further, even if the second end portion E12 contacts the second substrate SUB2 or the wiring line CL1, a short-circuit between the first end portion E11 and the conductive layer of the second substrate SUB2 or the wiring line CL1 can be suppressed.

Figure 9:
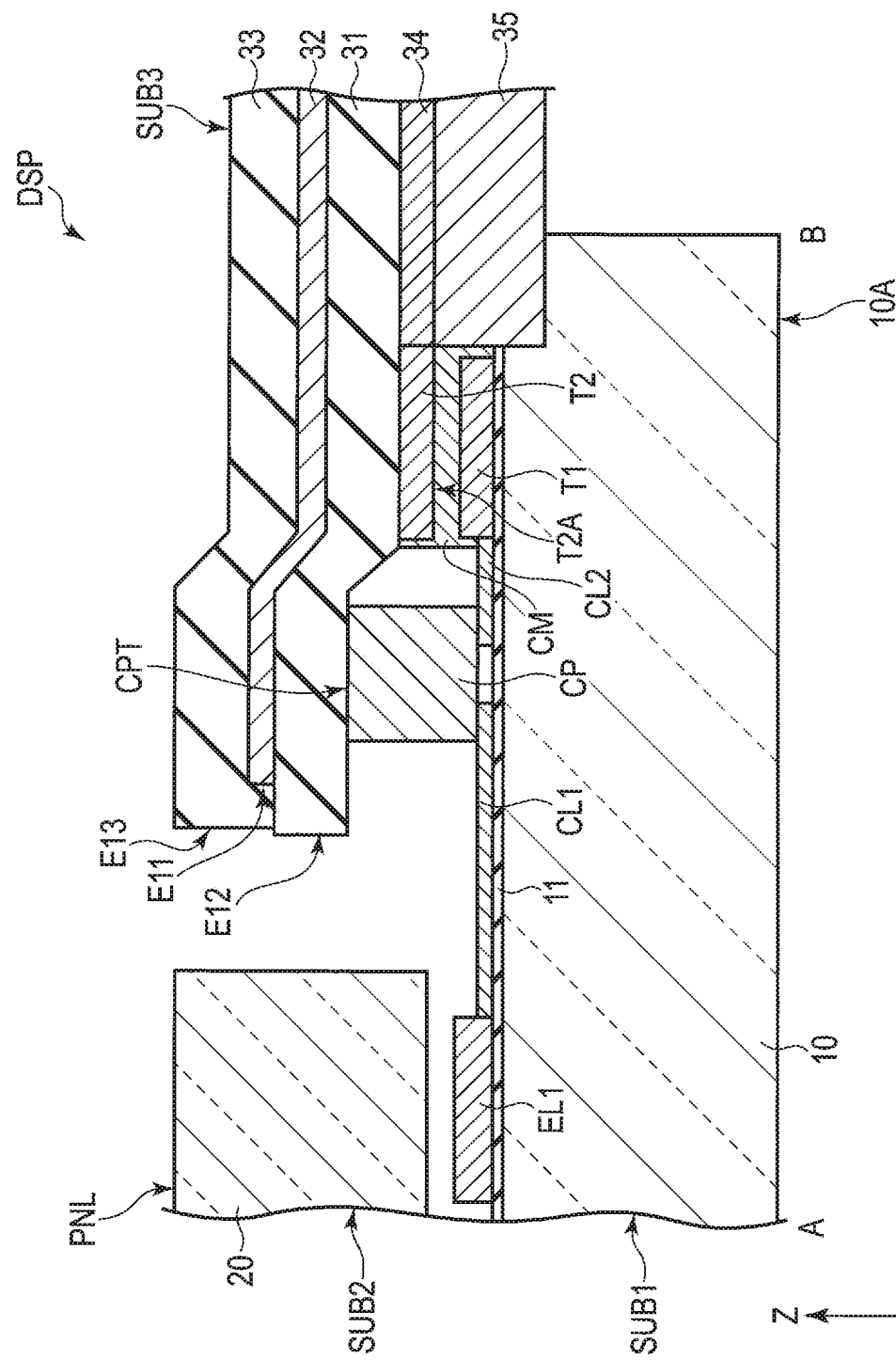
FIG. 9 is an illustration showing yet another cross-section of the display device DSP.

FIG. 9 is an illustration showing yet another cross-section of the display device DSP. A configuration example illustrated in FIG. 9 is different from that shown in FIG. 2 in that the overcoat layer 33 includes the third end portion E13 closer to the second insulating substrate 20 than the first end portion E11 of the electromagnetic shielding layer 32. The first end portion E11 is covered with the overcoat layer 33. Note that the second end portion E12 may be covered with the overcoat layer 33. In the example illustrated, the first end portion E11 and the third end portion E13 are located between the IC chip CP and the second insulating substrate 20.

Also in this configuration example, the same advantages as that of the above-described configuration example can be obtained. Further, in the electromagnetic shielding layer 32, the entirety including the first end portion E11 is covered with the overcoat layer 33. Further, even if the wiring substrate SUB3 contacts the second substrate SUB2 or the wiring line CL1, a short-circuit between the electromagnetic shielding layer 32 and the conductive layer of the second substrate SUB2 or the wiring line CL1 can be suppressed.

Figure 10:
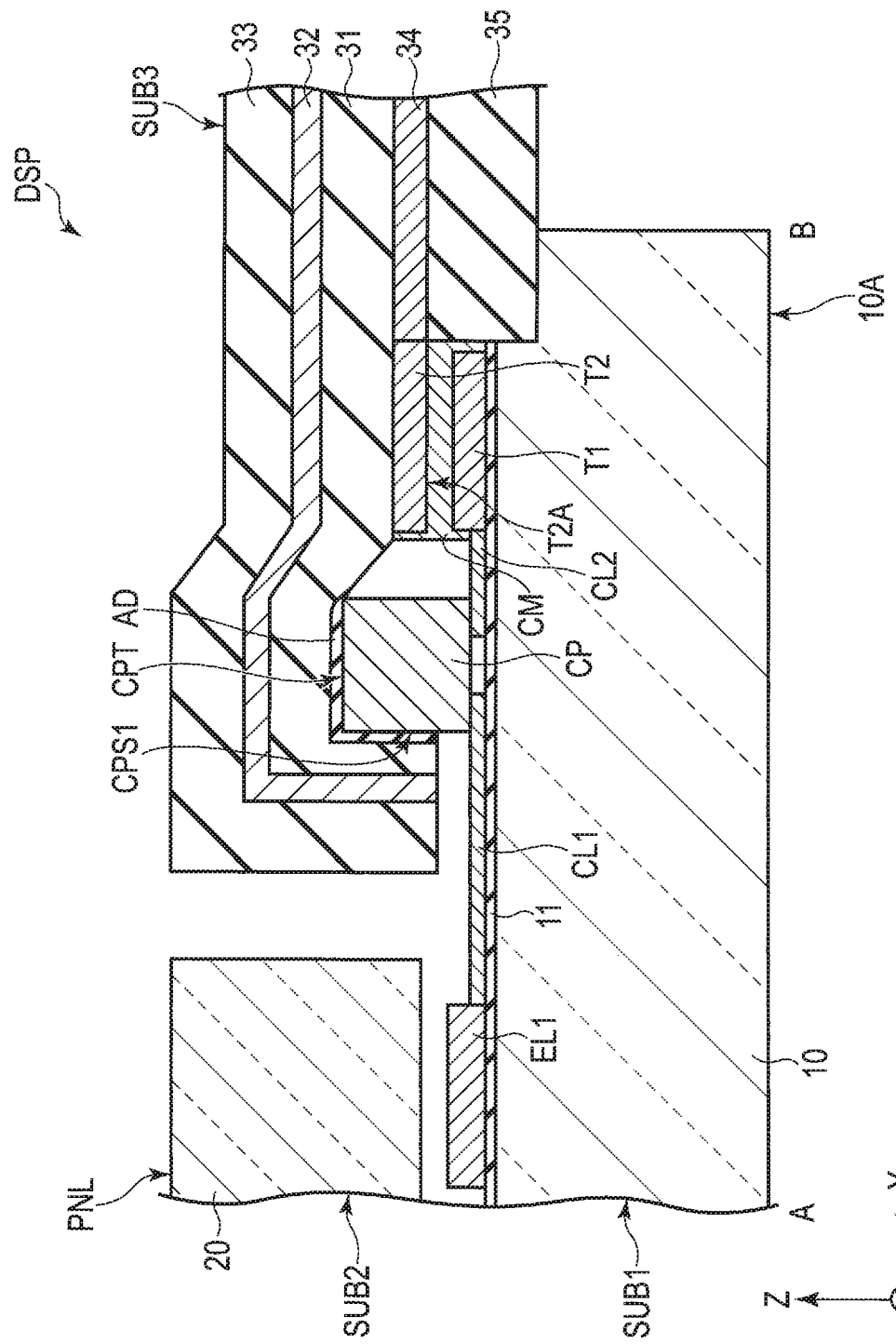
FIG. 10 is an illustration showing yet another cross-section of the display device DSP.

FIG. 10 is an illustration showing yet another cross-section of the display device DSP. A configuration example illustrated in FIG. 10 is different from that shown in FIG. 2 in that the electromagnetic shielding layer 32 covers the side surface CPS1 of the IC chip CP, which is opposed to the second insulating substrate 20. In the example illustrated, the wiring substrate SUB3 is bonded to the IC chip CP. In other words, an adhesive AD is interposed between a surface which includes the upper surface CPT and the side surface CPS1, and the base 31.

Also in this configuration example, the same advantages as that of the above-described configuration example can be obtained. Further, since the electromagnetic shielding layer 32 covers the side surface CPS1, electromagnetic interference noise from the IC chip CP can be suppressed. In particular, since the wiring substrate SUB3 including the electromagnetic shielding layer 32 is bonded to the IC chip CP, as compared to a case where the wiring substrate SUB3 is separated from the IC chip CP, leakage of electromagnetic interference noise from the IC chip CP can be suppressed effectively.

Figure 11:
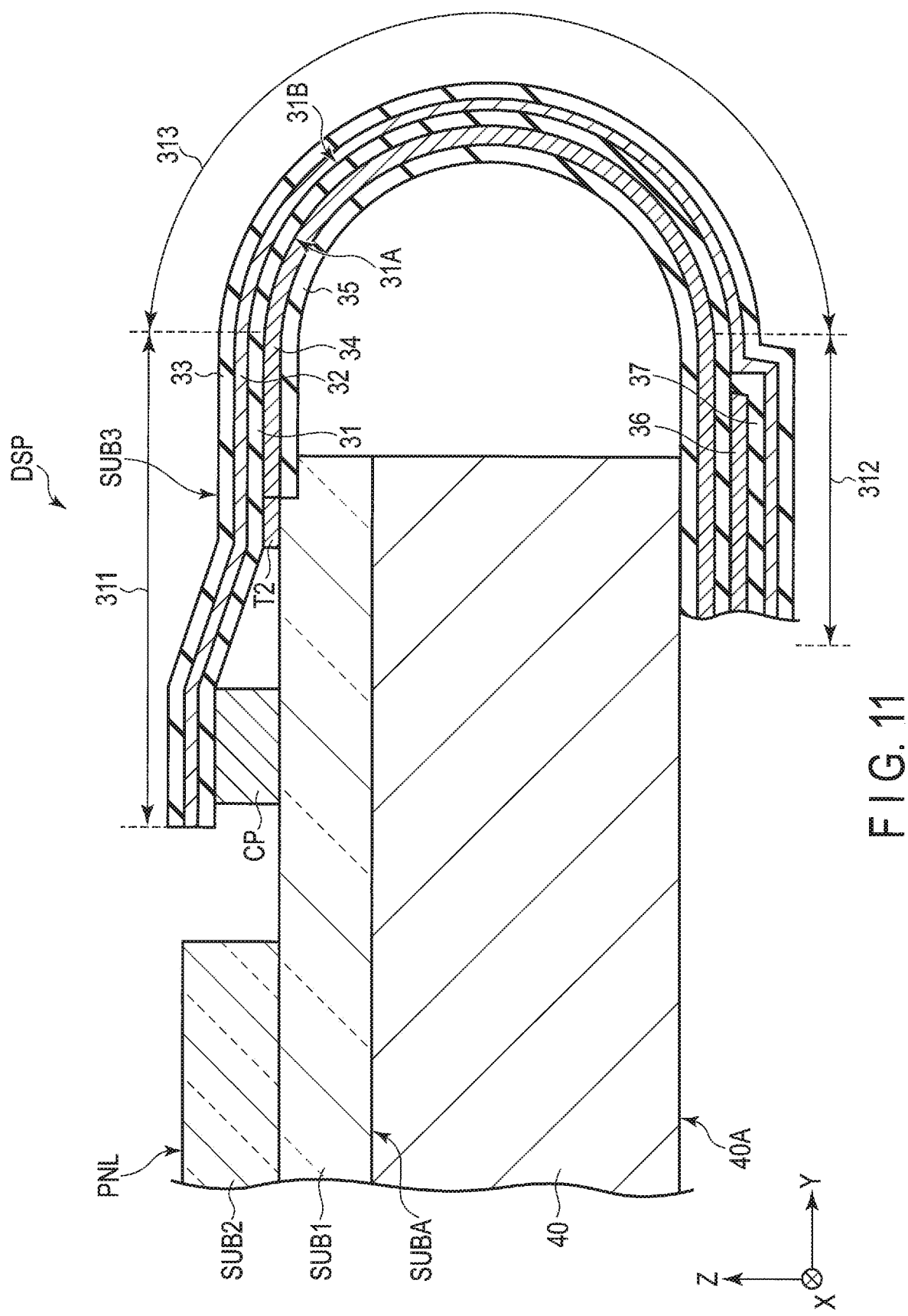
FIG. 11 is an illustration showing a cross-section of the display device DSP of the present embodiment.

FIG. 11 is an illustration showing a cross-section of the display device DSP of the present embodiment. Here, only the main portions necessary for explanation are shown, and the figure illustrates the state in which the wiring substrate SUB3 is folded toward to back surface of the display panel PNL. The first substrate SUB1 includes a back surface SUBA on a side opposite to the second substrate SUB2. The back surface of the display panel PNL corresponds to the back surface SUBA of the first substrate SUB1. In the example illustrated, the display panel PNL is a liquid crystal panel, and the illumination device 40 opposed to the back surface SUBA is arranged. The illumination device 40 includes a rear surface 40A on a side opposite to the display panel PNL. The wiring substrate SUB3 is folded in such a way that it encompasses the first substrate SUB1 and the illumination device 40.

The wiring substrate SUB3 comprises a second conductive layer 36 and an insulating layer 37, in addition to the base 31, the electromagnetic shielding layer 32, the overcoat layer 33, the first conductive layer 34, and the insulating cover 35. The base 31 includes a first region 311 in which the second terminal T2 is disposed, a second region 312 on a side opposite to the first region 311, and a third region 313 between the first region 311 and the second region 312. The first region 311 includes a portion overlapping the first substrate SUB1 and the IC chip CP. The second region 312 includes a portion overlapping the rear surface 40A. The third region 313 corresponds to a fold portion. The second region 312 is a region located on a lower side of the first region 311 with interposition of the first substrate SUB1 when the wiring substrate SUB3 is folded at the third region 313. The first conductive layer 34 is arranged over the first region 311, the second region 312, and the third region 313 on the first surface 31A of the base 31. The second conductive layer 36 is disposed in the second region 312 on the second surface 31B of the base 31, and is not disposed in the third region 313. In the example illustrated, the second conductive layer 36 is not disposed in the first region 311 either. The insulating layer 37 covers the second conductive layer 36. The electromagnetic shielding layer 32, the overcoat layer 33, and the insulating cover 35 are all disposed from the first region 311 to the third region 313.

In the wiring substrate SUB3 as described above, fewer conductive layers are provided in the third region 313 than in the second region 312. In the example illustrated, two conductive layers, i.e., the first conductive layer 34 and the second conductive layer 36, are disposed in the second region 312, and one conductive layer, i.e., the first conductive layer 34, is disposed in the third region 313. For this reason, the wiring substrate SUB3 can be folded easily at the third region 313.

In the example illustrated in FIG. 11, a case where the display panel PNL is a liquid crystal panel has been explained. However, when the display panel PNL is an organic EL panel, the illumination device 40 is not required. Thus, the wiring substrate SUB3 can be folded with a radius of curvature even smaller than that of the example illustrated in FIG. 11. Even in such a case, since the third region 313 includes less conductive layers than the second region 312, the wiring substrate SUBS can be folded easily in the third region 313.

As explained above, according to the present embodiment, a display device capable of improving its reliability can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a display panel comprising a first insulating substrate, a first electrode disposed on the first insulating substrate, an IC chip electrically connected to the first electrode, a first terminal electrically connected to the IC chip; and
a wiring substrate comprising a base including a first surface and a second surface opposite to the first surface, a second terminal disposed on the first surface and electrically connected to the first terminal, and an electromagnetic shielding layer disposed on the second surface and covering at least a part of the IC chip, wherein
the display panel further comprises a second insulating substrate opposed to the IC chip in a direction,
the electromagnetic shielding layer includes a first end portion located between the IC chip and the second insulating substrate in the direction, and
the base includes a second end portion closer to the second insulating substrate than the first end portion in the direction.

2. The display device of claim 1, wherein the electromagnetic shielding layer covers a whole of an upper surface of the IC chip.

3. The display device of claim 1, wherein a length of the electromagnetic shielding layer from the first end portion to a portion covering an upper surface of the IC chip is less than a height of the IC chip.

4. The display device of claim 1, wherein:
the wiring substrate further comprises an overcoat layer covering the electromagnetic shielding layer; and the overcoat layer includes a third end portion closer to the second insulating substrate than the first end portion in the direction.

5. The display device of claim 1, wherein the electromagnetic shielding layer covers a side surface of the IC chip opposed to the second insulating substrate.

6. The display device of claim 1, wherein:
the first insulating substrate includes a first plane, a second plane opposite to the first plane, and a third plane opposite to the first plane;
a thickness between the first plane and the second plane is greater than a thickness between the first plane and the third plane;
the first terminal is disposed on the second plane; and
the wiring substrate further comprises a first conductive layer connecting with the second terminal, and an insulating cover covering the first conductive layer and being in contact with the third plane.

7. The display device of claim 6, wherein the third plane is formed over a whole of a first side of the display panel.

8. The display device of claim 1, wherein:
the wiring substrate is folded toward a back surface of the display panel.

9. The display device of claim 1, wherein:
the base includes a first region in which the second terminal is disposed, a second region located on a back surface side of the display panel, and a third region located between the first region and the second region; and
the wiring substrate comprises conductive layers, a number of the conductive layers in the third region being fewer than a number of the conductive layers in the second region.

10. The display device of claim 1, wherein:
the base includes a first region in which the second terminal is disposed, a second region located on a back surface side of the display panel, and a third region located between the first region and the second region; and
the wiring substrate further comprises a first conductive layer connecting with the second terminal, and a second conductive layer located between the first conductive layer and the electromagnetic shielding layer; and
the second conductive layer is disposed in the third region, and is not disposed in the second region.

11. A display device comprising:
a display panel comprising a first insulating substrate, a first electrode disposed on the first insulating substrate, an IC chip electrically connected to the first electrode, and a first terminal electrically connected to the IC chip; and
a wiring substrate comprising a base including a first surface and a second surface opposite to the first surface, a second terminal disposed on the first surface and electrically connected to the first terminal, and an electromagnetic shielding layer disposed on the second surface and covering at least a part of the IC chip, wherein
the display panel further comprises a second insulating substrate opposed to the IC chip in a direction,
the electromagnetic shielding layer includes a first end portion located between the IC chip and the second insulating substrate in the direction,
the wiring substrate further comprises an overcoat layer covering the electromagnetic shielding layer, and
the overcoat layer includes a third end portion closer to the second insulating substrate than the first end portion in the direction.

12. The display device of claim 11, wherein the electromagnetic shielding layer covers a whole of an upper surface of the IC chip.

13. The display device of claim 11, wherein a length of the electromagnetic shielding layer from the first end portion to a portion covering an upper surface of the IC chip is less than a height of the IC chip.

14. The display device of claim 11, wherein the electromagnetic shielding layer covers a side surface of the IC chip opposed to the second insulating substrate.

15. The display device of claim 11, wherein:
the first insulating substrate includes a first plane, a second plane opposite to the first plane, and a third plane opposite to the first plane;
a thickness between the first plane and the second plane is greater than a thickness between the first plane and the third plane;
the first terminal is disposed on the second plane; and
the wiring substrate further comprises a first conductive layer connecting with the second terminal, and an insulating cover covering the first conductive layer and being in contact with the third plane.

16. The display device of claim 15, wherein the third plane is formed over a whole of a first side of the display panel.

17. The display device of claim 11, wherein:
the wiring substrate is folded toward a back surface of the display panel.

18. The display device of claim 11, wherein:
the base includes a first region in which the second terminal is disposed, a second region located on a back surface side of the display panel, and a third region located between the first region and the second region; and
the wiring substrate comprises conductive layers, a number of the conductive layers in the third region being fewer than a number of the conductive layers in the second region.

19. The display device of claim 11, wherein:
the base includes a first region in which the second terminal is disposed, a second region located on a back surface side of the display panel, and a third region located between the first region and the second region;
the wiring substrate further comprises a first conductive layer connecting with the second terminal, and a second conductive layer located between the first conductive layer and the electromagnetic shielding layer; and
the second conductive layer is disposed in the third region, and is not disposed in the second region.

* * * * *